(12) United States Patent
Aggeler et al.

(10) Patent No.: US 11,500,033 B2
(45) Date of Patent: Nov. 15, 2022

(54) GROUND FAULT DETECTION OF UPS BATTERY

(71) Applicant: ABB Schweiz AG, Baden (CH)

(72) Inventors: Daniel Aggeler, Jona (CH); Esa-Kai Paatero, Helsinki (FI); Ivan Furlan, Brissago (CH); Nicola Notari, Gentilino (CH); Yannick Maret, Dättwil (CH)

(73) Assignee: ABB SCHWEIZ AG, Baden (CH)

( * ) Notice: Subject to any disclaimer, the term of this patent is extended or adjusted under 35 U.S.C. 154(b) by 262 days.

(21) Appl. No.: 16/736,353

(22) Filed: Jan. 7, 2020

(65) Prior Publication Data
US 2020/0142007 A1 May 7, 2020

Related U.S. Application Data

(63) Continuation of application No. PCT/EP2018/068525, filed on Jul. 9, 2018.

(30) Foreign Application Priority Data

Jul. 10, 2017 (EP) ..................................... 17180605

(51) Int. Cl.
*G01R 31/52* (2020.01)
*H02J 9/06* (2006.01)
(Continued)

(52) U.S. Cl.
CPC ........... *G01R 31/52* (2020.01); *G01R 31/385* (2019.01); *G01R 31/389* (2019.01); *H02J 9/062* (2013.01)

(58) Field of Classification Search
CPC .... G01R 31/52; G01R 31/385; G01R 31/389; G01R 31/25; G01R 31/42; G01R 31/02; H02J 9/062; H01M 10/482
(Continued)

(56) References Cited

U.S. PATENT DOCUMENTS

| 2005/0121979 A1 | 6/2005 | Matsumoto et al. |
| 2007/0008666 A1 | 1/2007 | Morita et al. |

(Continued)

FOREIGN PATENT DOCUMENTS

| CN | 103282786 A | 9/2013 |
| CN | 106849326 A | 6/2017 |

(Continued)

OTHER PUBLICATIONS

Chinese Patent Office, First Office Action issued in corresponding Application No. 201880046289.7, dated Jun. 15, 2021, 16 pp.
(Continued)

*Primary Examiner* — Melissa J Koval
*Assistant Examiner* — Trung Q Nguyen
(74) *Attorney, Agent, or Firm* — Greenberg Traurig, LLP

(57) ABSTRACT

The present invention provides a method for detecting a ground fault in a battery of a uninterrupted power supply, the battery includes at least one string with multiple battery cells, the method including the steps of defining multiple individual battery blocks of battery cells along the at least one string, performing an reference impedance measurement for the multiple individual battery blocks at a first point of time, performing a verification impedance measurement for the multiple individual battery blocks at a second point of (Continued)

time, evaluating a change of measured impedance between the reference impedance and the verification impedance for the multiple individual battery blocks of the at least one string, and identifying a ground fault based on a correlated change of measured impedance of the multiple individual battery blocks along the at least one string. The present invention also provides a battery management system for managing a battery of a uninterrupted power supply, which is adapted to perform the above method. The present invention further provides a UPS device and a UPS system, each of which including an above battery management system.

17 Claims, 3 Drawing Sheets

(51) Int. Cl.
*G01R 31/385* (2019.01)
*G01R 31/389* (2019.01)

(58) Field of Classification Search
USPC ... 324/426–437, 500, 509, 520–524, 750.01, 324/750.16, 600, 612, 616, 629, 638–650, 324/76.11, 216
See application file for complete search history.

(56) References Cited

U.S. PATENT DOCUMENTS

| | | | | |
|---|---|---|---|---|
| 2014/0301000 | A1* | 10/2014 | Takahashi | H01M 10/482 361/42 |
| 2016/0245853 | A1* | 8/2016 | Weiss | G01R 31/52 |
| 2016/0261127 | A1* | 9/2016 | Worry | H02J 7/0026 |

FOREIGN PATENT DOCUMENTS

| | | |
|---|---|---|
| GB | 2352820 A | 2/2001 |
| JP | 2005158652 A | 6/2005 |
| JP | 2011209247 A | 10/2011 |
| JP | 2014217258 A | 11/2014 |

OTHER PUBLICATIONS

European Patent Office, International Search Report & Written Opinion issued in corresponding Application No. PCT/EP2018/068525, dated Oct. 16, 2018, 11 pp.

Faifer et al., "The Calibration of Loop Impedance Meters: a Proposal," IEEE Instrumentation and Measurement Technology Conference, Apr. 24-27, 2006, Sorrento, Italy, pp. 1620-1625.

China Second Office Action, issued by the National Intellectual Property Administration, regarding corresponding patent application Serial No. CN 201880046289.7; dated Feb. 7, 2022; 11 pages (with English Translation).

* cited by examiner

GROUND FAULT DETECTION OF UPS BATTERY

TECHNICAL FIELD

The present invention relates to a method for detecting a ground fault in a battery of a uninterrupted power supply, the battery comprises at least one string with multiple battery cells.

The present invention also relates to a battery management system for managing a battery of a uninterrupted power supply, the battery comprising at least one string with multiple battery cells, whereby the battery management system is adapted to perform the above method.

The present invention further relates to a UPS device comprising a central DC link, a power supply side AC/DC converter unit, a power supply side DC/DC converter unit, and a load side output converter unit, whereby all converter units are connected to the DC link, and the DC/DC converter is connected to a battery at its power supply side, wherein the UPS device comprises a battery management system as specified above.

The present invention still further relates to a UPS system comprising multiple UPS devices, each UPS device comprising a central DC link, a power supply side AC/DC converter unit, a power supply side DC/DC converter unit, and a load side output converter unit, whereby all converter units are connected to the DC link, and the DC/DC converters of the multiple UPS devices are connected to a battery at their power supply side, wherein the UPS system comprises a battery management system as specified above.

BACKGROUND ART

Uninterruptible power supplies (UPS) are known in different configurations. They have in common that they are connected to a power supply, frequently an AC power mains, as primary power supply, which provides power via the UPS to a load. Depending on the type of load, the UPS can provide AC or DC power to the load via the output converter. Hence, the output converter can be provided as a DC/AC converter or as a DC/DC converter.

Furthermore, UPSs are typically provided with an internal or external DC power supply as secondary power supply, which provides power via the UPS to the load in case of a failure of the primary power supply. Different kinds of failures are known to a person skilled in the Art. The DC power supply is typically provided as battery, which comprises at least one, frequently multiple, strings of multiple individual battery cells each. The multiple strings are connected parallel to each other within the battery, and the individual battery cells are connected in series within each of the multiple strings.

UPSs comprise uninterruptible power supply devices, which are typically provided as a module for parallel use, as well as UPS systems, which comprises multiple uninterruptible power supply devices, which are typically connected in parallel. Hence, the UPS devices can have a battery as DC source, or it is connected to an external battery. Depending on the connection to one or more batteries, a battery management can be performed on level of the UPS device or the UPS system. Both the UPS devices and the UPS systems are discussed here commonly as UPS to facilitate further reading.

Ground faults in the battery manifest themselves when an unwanted conductive path to ground is provided. The ground fault can occur at any location of the battery, i.e. between or at each of the individual battery cells. Several techniques exist for detection of a ground fault. Existing systems rely on a direct measurement or assessment of the ground fault impedance. However, these techniques are limited to certain types of UPS and do not enable a localization of the ground fault.

Most common approaches to detect a ground fault comprise a bridge circuit and a DC current sensing summation.

The bridge circuit refers to a traditional way to a detect ground fault. Accordingly, a string with a grounded middle-point is considered. Two equal resistors are provided in series between positive and negative string terminals, thereby forming the actual bridge circuit. In case of no ground fault, a voltage magnitude of the positive and negative terminals is equal, and the middle-point voltage of the bridge is zero. In case of a ground fault, the voltage magnitudes of the positive and negative terminals are different, and the middle point voltage of the bridge is different from zero. The bridge circuit is widely used with UPS configurations having an isolated input. However, it is not applicable for UPSs having non-isolated inputs.

The current sensing summation refers to another traditional way of detecting ground faults. The idea behind current sensing summation is to measure a current in both a negative and a positive leg of a string. If there are no ground faults in the legs, the measured currents sum up to zero. Different magnetic circuits, sometimes referred to as residual current sensors, are known to do this summation in a cheap and reliable way. The current sensing summation approach is widely used with UPSs having a non-isolated configuration.

A further way of ground fault detection is known as AC signal injection. According to AC signal injection, some UPS manufacturers propose not to directly connect a middle point of the battery to ground, but to insert a low-voltage AC voltage between the battery middle-point and ground. The AC source does not affect the UPS functionality but a ground fault will create an AC current flow through the battery. A simple AC current sensor, e.g. a Rogowski coil or others, can be used to measure this current. Since AC current sensors can be made insensitive to DC currents or DC voltages, this approach alleviates the problems when doing current sensing summation.

In all above cases, the location of the ground fault cannot be exactly determined. Additionally, the bridge circuit suffers from the disadvantage that ground faults close to the middle point of the string are difficult to detect. The current summation circuit suffers from the problem that it is hardly applicable to large power UPS, as the required current sensor then is not sensitive enough for low-leakage ground faults.

DISCLOSURE OF INVENTION

It is an object of the present invention to provide a method for detecting a ground fault in a battery of a uninterrupted power supply, a battery management system for performing the above method, a UPS device, and a UPS system comprising multiple UPS devices of the above mentioned type, which enable a reliable ground fault detection in a simple way. It is a further object of the present invention to enable a reliable ground fault localization in a simple way.

This object is achieved by the independent claims. Advantageous embodiments are given in the dependent claims.

In particular, the present invention provides a method for detecting a ground fault in a battery of a uninterrupted power supply, the battery comprises at least one string with multiple battery cells, the method comprising the steps of defining multiple individual battery blocks of battery cells along the at least one string, performing an reference impedance measurement for the multiple individual battery blocks at a first point of time, performing a verification impedance measurement for the multiple individual battery blocks at a second point of time, evaluating a change of measured impedance between the reference impedance and the verification impedance for the multiple individual battery blocks of the at least one string, and identifying a ground fault based on a correlated change of measured impedance of the multiple individual battery blocks along the at least one string.

The present invention also provides a battery management system for managing a battery of a uninterrupted power supply, the battery comprising at least one string with multiple battery cells, whereby the battery management system is adapted to perform the above method.

The present invention further provides a UPS device comprising a central DC link, a power supply side AC/DC converter unit, a power supply side DC/DC converter unit, and a load side output converter unit, whereby all converter units are connected to the DC link, and the DC/DC converter is connected to a battery at its power supply side, wherein the UPS device comprises a battery management system as specified above.

The present invention still further provides a UPS system comprising multiple UPS devices, each UPS device comprising a central DC link, a power supply side AC/DC converter unit, a power supply side DC/DC converter unit, and a load side output converter unit, whereby all converter units are connected to the DC link, and the DC/DC converters of the multiple UPS devices are connected to a battery at their power supply side, wherein the UPS system comprises a battery management system as specified above.

The basic idea of the invention is to use simple, preferably existing means for determining the impedance of the individual battery blocks. Based on a given number of individual battery blocks, a stochastic analysis provides an indication for a ground fault or not. The stochastic analysis is done by evaluating a correlated change of measured impedance of the multiple individual battery blocks along the at least one string. Hence, based on the number of individual battery blocks, for which the impedance is measured individually, the analysis provides as a result an indication for the occurrence of a ground fault. The ground fault can e.g. be determined using a common battery management system (BMS), which typically enables an impedance measurement for individual battery blocks.

The ground fault refers to a connection of any point of the string of battery cells to ground, e.g. based on a battery leakage shorting to ground. Hence, a string current through the string of battery cells comprises a fraction, which is diverted to ground at the location of the ground fault. Accordingly, the entire string current passes through individual battery blocks before the ground fault is reached. Due to the ground fault, a part of a string current through the string of battery blocks is diverted to ground, the remaining part of the string current passes through the remaining individual battery blocks. Hence, when assuming the same string current through all individual battery blocks, the measured impedance changes. However, the impedance has indeed not changed because of the ground fault, it is merely because of the measurement principle, which assumes that the entire string current passes through all individual battery blocks within a string. When doing individual current measurements, it would be relatively easy to identify a location of a ground fault. However, such current measurements are rather complex and expensive, so that the assumption of the string current being the same for all provides a simple and cheap way of determining the occurrence and preferably the location of the ground fault.

The definition of multiple individual battery blocks of battery cells along the at least one string refers to a definition of units, for which an individual impedance measurement can be performed. Typically, there is no technical difference between the individual battery blocks. Preferably, each individual battery block comprises the same number of battery cells, so that each individual battery block has essentially the same or at least a similar impedance. This facilitates evaluation of the correlated change of measured impedance of the multiple individual battery blocks.

Different techniques are known for performing impedance measurements, some of which will be discussed in further detail below. General basis for the impedance measurement is the measurement of a combination of current and voltage for each individual battery block. Many existing methods for measuring an impedance of battery blocks require the battery being in use, which can add errors to impedance measurements due to operating conditions, which are difficult to predict.

When the battery comprises more than one parallel string of battery cells, the measurements have to be performed individually for the individual battery blocks of each string. Hence, ground faults can be detected and localized for each string individually.

The identification of a ground fault based on a correlated change of measured impedance of the multiple individual battery blocks along the at least one string hinges on the fact that the measured battery impedances changes in a recognizable pattern in the presence of a ground fault. When considering a ground fault along the string of battery cells, a number of N individual battery blocks is located at one side of the ground fault, and a number of M individual battery blocks is located at the other side of the ground fault, whereby the current through N individual battery blocks is essentially identical, and the current through M individual battery blocks is also essentially identical. The current through the respective groups of battery blocks merely differs in a ground current in case of a ground fault. When the ground fault occurs, the measured impedance of the M or N individual battery blocks changes, which indicates the occurrence of the ground fault. If no statistically meaningful change of measured impedance of the multiple individual battery blocks along the at least one string is detected, no ground fault is present.

However, already a change of an overall measured impedance of the battery or one string of the battery indicates presence of a ground fault.

The battery can be integral part of the uninterruptible power supply (UPS) device or the uninterruptible power supply (UPS) system, or the battery can be a separate component, which is operated through the UPS device or the UPS system.

The battery management system is typically part of the UPS device or the UPS system. However, the BMS can also be a separate device. Preferably, the BMS is part of the UPS device or the UPS system, so that it can interact with the UPS device or the UPS system, e.g. when doing the impedance measurements of the individual battery blocks.

The BMS is typically provided to monitor different parameters of the battery, which is frequently done by measurements of voltage and current of the individual battery blocks. Hence, according to the present invention, functionality already available at the BMS can be used to detect ground faults in the battery. In particular, a change of measured impedance of a group of individual battery blocks can be detected as an indication for presence of a ground fault. Hence, the proposed method enhances BMS functionality with ground fault detection. Furthermore, the BMS can control an existing UPS device or UPS system to create a current through the battery, as discussed later in detail.

The load can be any suitable kind of load. E.g. the load can be a DC load or an AC load. Hence, the output converter can be provided as a DC/AC converter or as a DC/DC converter, depending on the requirements of the load.

According to a modified embodiment of the invention, the step of defining multiple individual battery blocks of battery cells along the at least one string comprises defining each of the multiple individual battery blocks comprising few individual battery cells, preferably one battery cell. With a given number of battery cells, the smaller the number of the battery cells in each individual battery block, the higher the number of individual battery blocks. Accordingly, the number of measured impedances is higher. Since the detection of the ground fault is based on a stochastic approach, increasing the number of measurements increases the number of samples, thereby increasing the reliability in detecting the occurrence of the ground fault. Preferably, few battery cells refers to not more than five battery cells, further preferred to not more than three battery cells, and even more preferred to not more than two battery cells.

According to a modified embodiment of the invention, the steps of performing a reference impedance measurement and performing a verification impedance measurement for the multiple individual battery blocks each comprise generating at least one current pulse through the battery, measuring a voltage across each of the multiple individual battery blocks as response to the at least one current pulse, measuring a current across the multiple individual battery blocks as response to the at least one current pulse, and determining the impedance of each individual battery block based on the voltage and the current measured across the individual battery block as response to the at least one current pulse. Preferably, the BMS creates the at least one pulse through the battery. Further preferred, the BMS creates the at least one pulse using the UPS device or the UPS system. Accordingly, measurements of the impedance can be performed independently from the usage of the battery. Since the measurements can be performed using the existing UPS device, the existing UPS system and/or the existing BMS, no hardware modifications are required. During and after the at least one current pulse, the voltage and current across each individual battery block can be determined as basis for determining the impedances of the individual battery blocks. The current pulses do not need to be square, but can have any suitable shape, as long as their frequency content is rich, e.g. pure sinusoidal signals, square wave, PRBS, white noise, or others. The pulse current of the current pulse should be sufficiently large in order to produce a well measurable voltage drop. E.g. a battery with an impedance of 10 m$\Omega$ requires a current of a few Amperes in order to produce a voltage change in the range of tens of mV. Additionally, the pulse current and the duration of the pulse shall be small enough to not increase the temperature of the battery by more than a fraction of Kelvin. Typically, a pulse current of 5-10 A can be used for monitoring the impedance of the battery, when the battery has an impedance in the order of tens of milliohms. A pulse duration of the current pulse is preferably in the order of hundreds of milliseconds. On the one hand, it should be as short as possible in order not to modify a state of charge of the battery. On the other hand, the pulse should be long enough to capture slow transient effects of interest to determine the at least one battery parameter, i.e. the impedance of the individual battery blocks. The rising edge and falling edge of the current pulse need to be sharp in order to have a rich-enough frequency content of e.g. up to a few hundred hertz. In general, the bandwidth of a step signal is given by 0.35/RT, where RT is the rise time of the edge. Accordingly, a bandwidth of e.g. 300 Hz requires a rise time of less than 1 ms. A current-voltage relationship with rich frequency content enables reliable determination of the impedance of the multiple individual battery blocks. In principle, the current for each battery block could be individually measured, which is however very expensive.

According to a modified embodiment of the invention, the step of generating at least one current pulse through the battery comprises generating at least one charge pulse and/or at least one discharge pulse. Each type of current pulse can be used to determine the at least one battery parameter. Charge current as well as discharge current provide a specific characteristic behavior of the battery.

According to a modified embodiment of the invention, the step of generating at least one current pulse through the battery comprises generating a current pulse train. The current pulse train comprises a sequence of multiple pulses, which can be different or identical pulses. E.g., the pulse train may comprise alternating discharge and charge pulses, so that a sum of energy transfer between the battery and the DC/DC converter is essentially zero. The current pulse train comprises typically a break between two subsequent pulses, where no current flows through the battery. Breaks between different pulses can have different lengths, depending on effects to be achieved. For example, an effect called "coup de fouet" refers to a phenomenon associated with voltage drop at the beginning of discharge of a battery, in particular of a lead acid battery. E.g. when determining an impedance of the battery, the "coup de fouet" may lead to erroneous measurements. To overcome this problem, several subsequent pulses can be generated in order to chemically excite the battery and to clear effects such as "coup de fouet". The measurements are then preferably started after clearing this effect. Furthermore, the more pulses are measured, more information becomes available to determine the impedance of the individual battery blocks. Since the train of multiple current pulses can lead to a significant discharge or to an increase of the temperature of the battery, the breaks should be chosen sufficiently long in order to reduce the impact of such effects. Discharge of the battery is preferably limited to a fraction of percent points, and temperature change is preferably limited to a fraction of Kelvin. Further preferred, in order to avoid falsification of the measurement results, the battery shall not be used by the UPS during the pulse train.

According to a modified embodiment of the invention, the method comprises verifying a validity of the reference impedance measurement based on an elapsed period of time between the reference impedance measurement and the verification impedance measurement, and performing a further reference impedance measurement when the elapsed period of time exceeds a given time limit. Battery parameters typically change over time. This is also valid for the impedance. Accordingly, even without occurrence of a ground fault, the impedance of some, multiple or all individual battery blocks may change over time. Hence, an impedance change due to occurrence of a ground fault can more reliably detected, if the reference impedance has been measured shortly before doing the measurement of the verification impedance. A time limit of up to several months has proven suitable, preferably less than six months or further preferred less than three months. Since battery parameters can change e.g. depending on a temperature, a state-of-charge, or other, it is preferred that the measurements of the verification impedance and the reference impedance are performed under the same or at least similar conditions as defined e.g. by the above parameters. However, since this can be difficult, when these parameters are monitored together with the measurements of the verification impedance and the reference impedance, the comparison of the measured verification impedance and the reference impedance can be performed under consideration of these parameters. E.g. a correction of the measured verification impedance and/or the reference impedance can be performed based on these parameters.

According to a modified embodiment of the invention, the step of identifying a ground fault based on a correlated change of measured impedance of the individual battery blocks along the at least one string comprises a step of localizing a position of the ground fault by identifying a sequence of individual battery blocks with a correlated change of measured impedance compared to another sequence of individual battery blocks along the at least one string. The sequence of individual battery blocks along the at least one string refers to a sequence of subsequent individual battery blocks. A group of individual battery blocks, that exhibits a correlated electrical parameters variations, i.e. a variation in the impedance, is linked to the fault location.

According to a modified embodiment of the invention, the step of identifying a sequence of individual battery blocks with a correlated change of measured impedance compared to another sequence of individual battery blocks along the at least one string comprises determining a change of measured impedance individually for each individual battery block. Since the individual battery blocks typically have a slightly different impedance, the precision of detecting a ground fault can be increased by evaluating an individual change of the impedance for each individual battery block. Since it is supposed that essentially the same current flows through all individual battery blocks, the change of measured impedance is supposed to be in a similar range.

According to a modified embodiment of the invention, the step of identifying a sequence of individual battery blocks with a correlated change of measured impedance compared to another sequence of individual battery blocks along the at least one string comprises performing a change detection algorithm or a signal segmentation algorithm. Such algorithms can be efficiently used when splitting a signal into two contiguous intervals, each with constant amplitude. The intervals refer to a set of subsequent individual battery blocks prior to a location of a ground fault and a set of subsequent individual battery blocks further on from the location of the ground fault. Also other change detection algorithms exist, which can be used. As already stated, if a statistically meaningful change in the impedance of the individual battery blocks cannot be found, no ground fault is present. If a meaningful change, or segmentation, can be found, there is the indication of a ground fault and the location of the change in impedance through the string of individual battery blocks indicates a location of the fault.

BRIEF DESCRIPTION OF DRAWINGS

These and other aspects of the invention will be apparent from and elucidated with reference to the embodiments described hereinafter.

In the drawings.

DETAILED DESCRIPTION OF THE INVENTION

Figure 1:
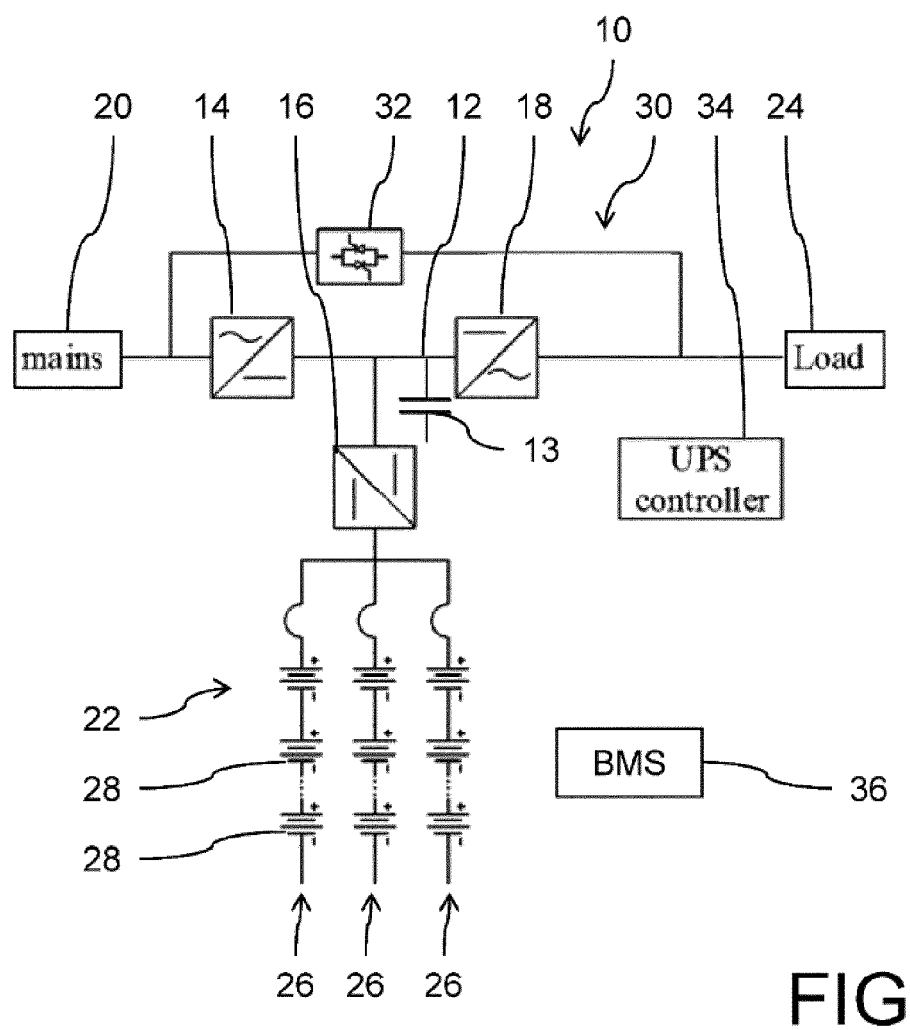
FIG. 1 shows a schematic view of a double conversion uninterruptible power supply (UPS) device with bypass according to a first, preferred embodiment of the present invention together with a battery management system connected thereto.

FIG. 1 shows a uninterruptible power supply (UPS) device 10 according to a first, preferred embodiment of the present invention. The UPS device 10 is a double conversion UPS device 10. The UPS device 10 can also be referred to simply as UPS 10.

The UPS device 10 of the first embodiment comprises a central DC link 12, a power supply side AC/DC converter 14, a power supply side DC/DC converter 16, and a load side output converter 18, which is a DC/AC converter 18 in this embodiment. All converters 14, 16, 18 are connected to the DC link 12. Although the AC/DC converter 14 and the DC/DC converter 16 are connected to different types of power supplies, they are both here considered as connected at a power supply side of the UPS device 10. The DC link 12 further comprises storage capacitors 13, one of which is shown by way of example in FIG. 1. The AC/DC converter 14 is connected to an AC power supply 20, and the DC/DC converter 16 is connected to a battery 22. The output converter 18 is connected to a load 24. The load 24 can be any suitable kind of load 24. E.g. the load can be a DC load or an AC load. Hence, the output converter 18 can be provided as a DC/AC converter or as a DC/DC converter, depending on the requirements of the load 24.

The battery 22 comprises multiple strings 26, which are provided in parallel within the battery 22. Each of the strings 26 comprises multiple individual battery blocks 28, which are connected in series in each string 26. According to the first embodiment, each individual battery block 28 comprises one battery cell. Hence, each of the individual battery blocks 28 has the same number of battery cells. The parallel strings 26 have the same setup with the same number of individual battery blocks 28. The setup of a string 26 of the battery 22 can be seen e.g. in FIGS. 3 and 4. In an alternative embodiment, each individual battery block 28 comprises the same number of multiple battery cells.

The battery 22 can be integral part of the UPS device 10, or the battery 22 can be a separate component, which is operated through the UPS device 10.

The UPS device 10 of the first embodiment further comprises a bypass 30 with a bypass switch 32, which is provided in this embodiment as silicon controlled rectifier, also referred to as scr. The bypass 30 provides a connection between the AC power supply 20 and the load 24, which is provided in parallel to the AC/DC converter 14, the DC link 12, and the output converter 18.

The UPS device 10 of the first embodiment also comprises a controller 34, which controls the operation of all controllable components of the UPS device 10, i.e. the AC/DC converter 14, the DC/DC converter 16, the output converter 18 bypass switch 32. Furthermore, the controller 34 receives measurement results from current and/or voltage measurements as performed by the DC/DC converter 16.

The UPS device 10 of the first embodiment further comprises a battery management system (BMS) 36. The BMS 36 is part of the UPS device 10. However, in an alternative embodiment, the BMS 36 is a separate device. Since the BMS 36 is part of the UPS device 10, it can interact with the UPS device 10, e.g. when doing the impedance measurements of the individual battery blocks 28. The BMS 36 is provided to monitor different parameters of the battery 22, which is done by measurements of voltage and current of the individual battery blocks 28, as discussed later in more detail.

Further components of the UPS device 10, which are not essential for understanding the present invention, are not shown in FIG. 1. However, a person skilled in the Art knows how to implement such components as required.

Figure 2:
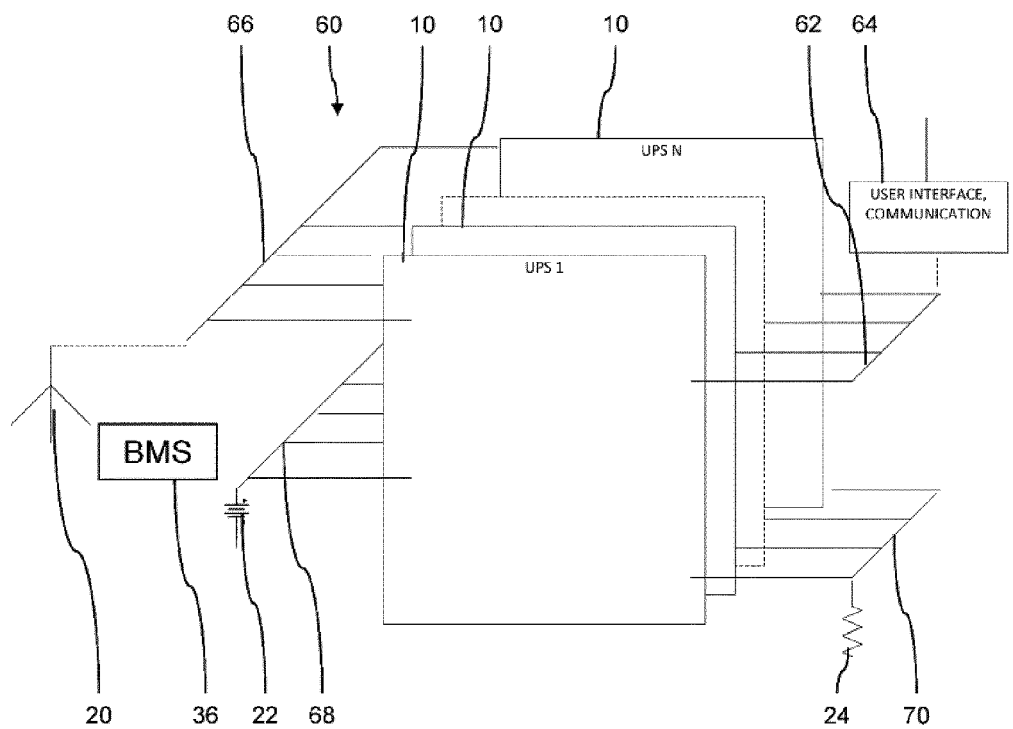
FIG. 2 shows a schematic view of a UPS system according to a second embodiment of the present invention with multiple UPS devices of the first embodiment connected in parallel together with a battery management system connected thereto.

A UPS system 40 according to a second embodiment can be seen in FIG. 2. The UPS system 40 comprises multiple UPS devices 10, which are connected in parallel. In this embodiment, the UPS devices 10 are UPS devices 10 of the first embodiment. In an alternative embodiment, the UPS system 40 comprises any other kind of suitable UPS devices 10. The UPS system 40 can also be referred to simply as UPS 40.

As can be further seen in FIG. 2, the UPS system 40 comprises a communication bus 42, which interconnects the UPS devices 10. Furthermore, a user interface 44 is connected to the communication bus 42. The UPS system 40 further comprises an AC power supply bus 46, which interconnects the AC/DC converters 14 of the UPS devices 10. The AC power supply bus 46 is connected to an AC power supply 20. The UPS system 40 still further comprises a DC battery supply bus 48, which interconnects the DC/DC converters 16 of the UPS devices 10. The DC battery supply bus 48 is connected to battery 22. Accordingly, the UPS devices 10 are commonly connected to a single battery 22. The UPS system 40 also comprises a load bus 50, which interconnects the output converters 18 of the UPS devices 10. The load bus 50 is connected to a common load 24.

Figure 5:
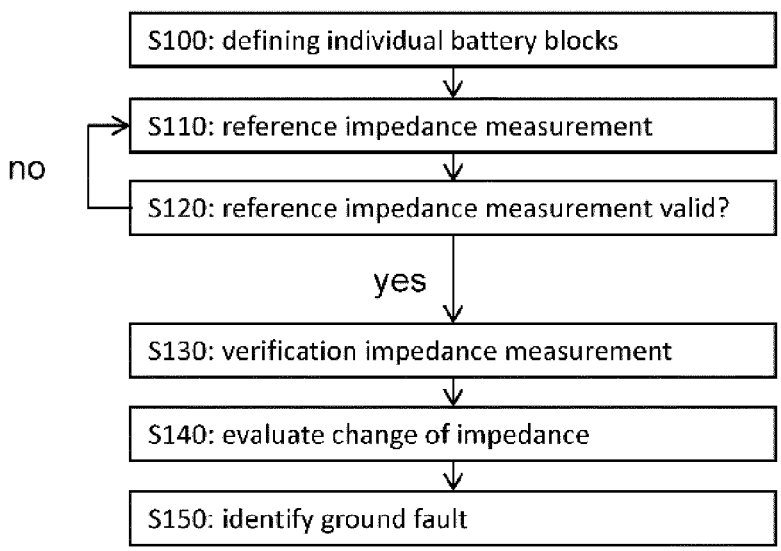
FIG. 5 shows a flow chart of a method for monitoring a battery connected to a UPS device of the first embodiment according to a fifth embodiment of the present invention.

Subsequently, a method for detecting a ground fault 60 in a battery 22 of the uninterrupted power supply device 10 or the uninterrupted power supply system 40 will be discussed with respect to FIG. 5.

The method starts with step S100, which refers to defining multiple individual battery blocks 28 of battery cells along each string 26 of the battery 22. In this embodiment, each individual battery block 28 comprises one battery cell.

According to step S110, a reference impedance measurement is performed for each of the multiple individual battery blocks 28 at a first point of time. Hence, the BMS 36 uses the UPS device 10 to create a current pulse train through each string 26 of the battery 22. The current pulse train comprises a sequence of multiple pulses, which a sequence of different or identical discharge and charge pulses, so that a sum of energy transfer between the battery 22 and the DC/DC converter 16 is almost zero. The current pulse train comprises a break or gap between two subsequent pulses, where no current flows through the battery 22. The sequence of pulses is generated in order to chemically excite the battery 22 and to clear effects such as "coup de fouet". "Coup de fouet" refers to a phenomenon associated with voltage drop at the beginning of discharge of the battery 22, in particular a lead acid battery.

Measurements of a voltage and a current across each of the multiple individual battery blocks 28 are performed as response to the sequence of current pulses after clearing this effect. The impedances can be seen in FIG. 3 for one string 26 of the battery 22 without ground fault 60. The impedance of each individual battery block 28 is determined as reference impedance based on the voltage and the current measured across the string 26 of individual battery blocks 28 as response to the current pulses. Discharge of the battery 22 is limited to a fraction of percent points, and temperature change is limited to a fraction of Kelvin. The battery 22 is not used by the UPS device 10 during the pulse train, i.e. in case the UPS device 10 needs power from the battery 22 during the measurements, the measurements are repeated later on.

Figure 3:
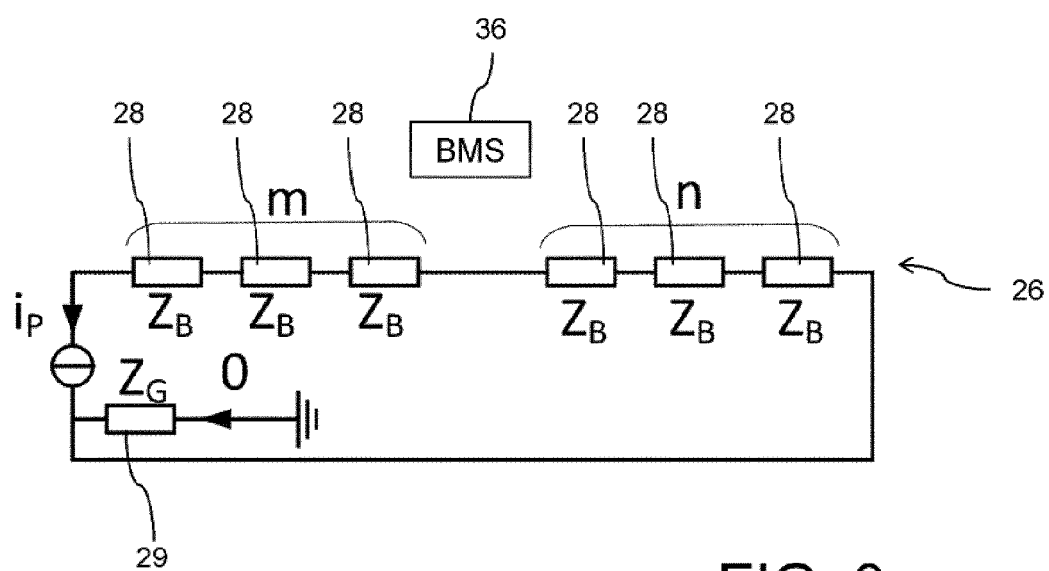
FIG. 3 shows an equivalent circuit diagram of a string of the battery of the first or second embodiment with multiple individual battery blocks without a ground fault.
Figure 4:
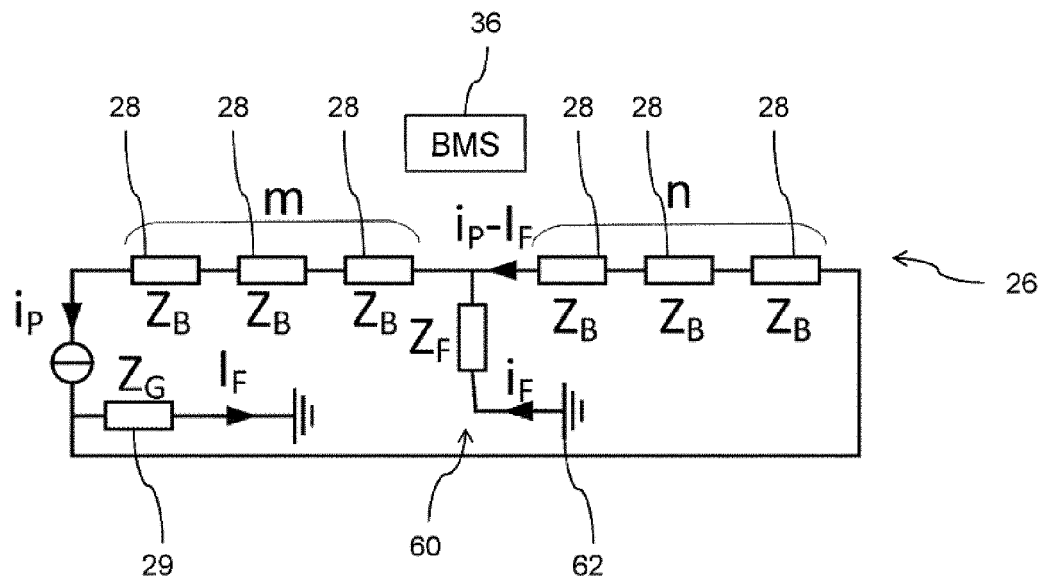
FIG. 4 shows an equivalent circuit diagram of the string of the battery of the first or second embodiment with multiple individual battery blocks, as shown in FIG. 3, with a ground fault.

FIGS. 3 and 4 also show a system impedance to ground 29 of the UPS device 10. The exact value of the system impedance to ground 29 depends on the type of input isolation. The system impedance to ground 29 encompasses all the paths to ground within the UPS device 10 and is therefore not well-defined. The system impedance to ground 29 is usually large for isolated input or small for non-isolated input. The same applies in case of a UPS system 40 respectively.

The current pulses have any suitable shape, as long as their frequency content is rich, e.g. square, pure sinusoidal signals, square wave, PRBS, white noise, or others. A pulse current of the current pulse is sufficiently large in order to produce a well measurable voltage drop. Additionally, the pulse current and the duration of the pulse are small enough to not increase the temperature of the battery 22 by more than a fraction of Kelvin. Typically, a pulse current of 5-10 A is used for monitoring the impedance of the battery 22, i.e. the individual battery blocks 28, when the battery 22 has an impedance in the order of tens of milliohms. A pulse duration of the current pulse is in the order of hundreds of milliseconds. A rising edge and a falling edge of each current pulse is sharp enough in order to have a rich-enough frequency content of e.g. up to a few hundred hertz. In general, the bandwidth of a step signal is given by 0.35/RT, where RT is the rise time of the edge. Accordingly, a bandwidth of e.g. 300 Hz requires a rise time of less than 1 ms. Together with the measurement of the reference impedance, environmental parameters including e.g. a temperature and an humidity are measured and recorded. Furthermore, also other parameters including e.g. a state of charge of the battery 22 are performed and recorded.

According to step S120, a validity of the reference impedance measurement is verified based on an elapsed period of time between the reference impedance measurement and the verification impedance measurement. In case the elapsed period of time exceeds a given time limit, which is three months in this embodiment, the method returns to step S110 and a further reference impedance measurement is performed. Otherwise, the method continues with step S130.

According to step S130, a verification impedance measurement is performed for the multiple individual battery blocks 28 at a second point of time. The measurement of the verification impedances is performed as discussed above for the reference impedances. Together with the measurement of the verification impedance, environmental parameters including e.g. a temperature and a humidity are measured and recorded. Furthermore, also other parameters including e.g. a state of charge of the battery 22 are performed and recorded.

According to step S140, a change of measured impedance between the reference impedance and the verification impedance for the multiple individual battery blocks 28 of each string 26 is evaluated. The change of measured impedance is a difference between the reference impedance and the verification impedance for each individual battery block 28. Since battery parameters can change e.g. depending on a temperature, a state-of-charge, or other, it is verified if the measurements of the verification impedance and the reference impedance were performed under the same or at least similar conditions as defined e.g. by the above parameters. In case of a significant variation of the parameters, a correction of the measured verification impedance and/or the reference impedance is performed based on these parameters.

According to step S150, ground fault 60 is identified based on a correlated change of measured impedance of the multiple individual battery blocks 28 along the string 26. The ground fault 60 refers to a connection of any point of the string 26 of battery cells to ground 62, e.g. based on a battery leakage shorting to ground 62. Ground faults 60 are detected for each string 26 individually. Already a change of an overall measured impedance of the battery 22 or of one string 26 of the battery 22 indicates presence of a ground fault 60. If a statistically meaningful change in the measured impedance of the individual battery blocks 28 cannot be found, no ground fault 60 is present. If a meaningful change, or a segmentation, can be found, this is an indication of a ground fault 60, and the location of the change in the measured impedance through the string 26 of individual battery blocks 28 indicates a location of the ground fault 60, as discussed below in more detail.

The identification of a ground fault 60 is based on a correlated change of measured impedance of the individual battery blocks 28 along each string 26 of the battery 22. When considering a ground fault 60 along the string 26 of battery cells, a number of N individual battery blocks 28 is located at one side of the ground fault 60, and a number of M individual battery blocks 28 is located at the other side of the ground fault 60. The current through N individual battery blocks 28 is essentially identical, and the current through M individual battery blocks 28 is essentially identical. The current through the respective groups of individual battery blocks 28 differs in a ground current in case of the ground fault 60. When the ground fault 60 occurs, the measured impedance of the M or the N individual battery blocks 28 changes, which indicates the occurrence of the ground fault 60, as can be seen in FIG. 4.

According to a first approach, a change of measured impedance can be calculated based on $$Z_b' = Z_b \cdot \left(1 - \frac{1}{1 + \frac{Z_g + Z_f}{Z_b \cdot n}}\right) \quad \text{(equation 1)}$$

With an impedance $Z_F$ of the ground fault 60 being much larger than an impedance $Z_G$ to ground 62, and the impedance $Z_B$ being the impedance of an individual battery block 28, the above can be approached by $$Z_b' \approx Z_b \cdot \left(1 - \frac{Z_b \cdot n}{Z_f}\right). \quad \text{(equation 2)}$$

In the embodiment shown in FIGS. 3 and 4 and with typical values of $Z_B$=10 mΩ, n=6 and $Z_F$=100 mΩ, this results in a change of measured impedance of 0.06% between the first and the second point of time, which is pretty small. However, multiple individual battery blocks 28 experience this change in the measured impedance, so that an overall change of measured impedance of the individual battery blocks 28 affected by the ground fault 60 is summed up. Without occurrence of a ground fault 60, the change of measured impedance will be approximately zero between the reference impedance and the verification impedance.

If a ground fault 60 actually developed between the first and the second point of time, the measured impedance of a whole group of individual battery blocks 28 changed. Since all individual battery blocks 28 in this group experience the same changed current, the estimated impedances for all individual battery blocks 28 in this group exhibit the same percent error. Hence, the increase of measured impedance of each potential location of ground fault 60 is checked, i.e. between each pair of individual battery blocks 28. In other words, the BMS 36 assumes a ground fault 60 at one individual battery block 28 and checks for a consistent change of measured impedance in the group consisting of the subsequent individual battery blocks 28 in the string 26. The BMS 36 steps through the entire string 26 and evaluated the change of measured impedance for each possible group of individual battery blocks 28. This enables localizing a position of the ground fault 60 by identifying a sequence of individual battery blocks 28 with a correlated change of measured impedance compared to another sequence of individual battery blocks 28 along each string 26.

A detailed approach is specified in mathematical terms as follows. With $\Delta Z_k$=1 . . . N being a relative change of measured impedance between the first and the second point of time for an individual battery block 28 identified by index k within the string 26 comprising N individual battery blocks 28, it is assumed that all individual battery blocks 28 share the same current under ideal conditions. Here, $\Delta Z_k = Z_k'/Z_k$, where $Z_k$ is the reference impedance prior to the occurrence of the ground fault 60, and $Z_k'$ is the verification impedance after the ground fault 60 occurred. If the k-th individual battery block 28 is in a group m of individual battery blocks 28, that sees the full test current, as can be seen in FIG. 4, then $\Delta Z_k$=0.

If the individual battery block 28 is in the group n of individual battery blocks 28, that sees the only part of the test current, the change of measured impedance becomes $\Delta Z_k = Z_{\Sigma n}/Z_F$, where $Z_{\Sigma n}$ is the sum of the measured impedances of all individual battery blocks 28 experiencing a reduced current. Using this approach, $\Delta Z_k$ has theoretically the same value for each individual battery block 28 within the group of m individual battery blocks 28 experiencing the full test current (i.e. $\Delta Z_k$=0), and $\Delta Z_k$ has another value, which is constant, for each individual battery block 28 within the group of n individual battery blocks 28 experiencing only part of the test current, which is approximately $Z_{\Sigma n}/Z_F$. In practice, there will be slight differences because of measurement noise and errors.

According to FIG. 4, a fault to ground 62 occurred around an individual battery block 28 with index f between the first and the second point of time. Since the period of time between the first and the second point of time does not exceed the given time limit, it is assumed that the actual impedance of the individual battery blocks 28 has not changed. Hence, when a change of measured impedance occurs, this is assumed to be based on occurrence of a ground fault 60.

Under further consideration of $k_{-f}$ being sample average of the $\Delta Z_k$ for k=1 ... (f−1) and $X_{+f}$ being sample average of the $\Delta Z_k$ for k=(f−1) ... N. If $X_{+f}$ is different from zero in a statistically significant manner, it implies that there is high likelihood of a ground fault 60 close to individual battery block 28 with index f. This can, for example, be assessed via a statistical test such as the Student's t-test.

For the particular case of the Student's t-test, when considering a group of ten individual battery blocks 28 whose impedances are measured with a statistical accuracy equivalent to a standard deviation of one percent point. This means that a 95% of the measured values are within ±2% of the mean. It can then be shown that if the sample average $X_{+f}$ is larger than 0.7%, the difference is statistically significant with a confidence interval of 95%. Equivalently, if the impedance of each of the individual battery blocks 28 is measured with a statistical accuracy equivalent to a standard deviation of one tenth of a percent point, then a variation of a group impedance by 0.07% can be detected—which is the typical value estimated previously. This can be achieved with a measurement, which does not have to have an increased accuracy. If the measurement system is consistent, it is sufficient to average the measured impedance a sufficient number of times in order to obtain the required statistical accuracy. Alternatively, a known SNR (signal to noise ration) improvement method can be used to obtain a good impedance estimate of the individual battery blocks 28 to start with. Additionally, there is the presence of a test group, i.e. those batteries that do not experience the changed current. The group test can allow to further improve the reliability of the method.

Furthermore, a change detection algorithm or a signal segmentation algorithm can be performed. A set of subsequent individual battery blocks 28 prior to a location of a ground fault 60 and a set of subsequent individual battery blocks 28 further on from the location of the ground fault 60 are determined.

While the invention has been illustrated and described in detail in the drawings and foregoing description, such illustration and description are to be considered illustrative or exemplary and not restrictive; the invention is not limited to the disclosed embodiments. Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

REFERENCE SIGNS LIST 10 uninterruptible power supply device, UPS device, uninterruptible power supply
12 DC link
13 storage capacitor
14 AC/DC converter
16 DC/DC converter
18 output converter, DC/AC converter
20 AC power supply
22 battery
24 load
26 string
28 battery block
29 system impedance to ground
30 bypass
32 bypass switch
34 controller
36 battery management system, BMS
40 uninterruptible power supply system, UPS system, uninterruptible power supply
42 communication bus
44 user interface
46 AC power supply bus
48 DC battery supply bus
50 load bus
60 ground fault
62 ground

The invention claimed is:

1. A method for detecting a ground fault in a battery of an uninterrupted power supply, the battery comprises at least one string with multiple battery cells, the method comprising the steps of:
    defining, by a battery management system, multiple individual battery blocks of battery cells along the at least one string,
    performing, by the battery management system, a reference impedance measurement of the multiple individual battery blocks at a first point of time,
    performing, by the battery management system, a verification impedance measurement for the multiple individual battery blocks at a second point of time,
    evaluating, by the battery management system, a change of measured impedance between the reference impedance and the verification impedance for the multiple individual battery blocks of the at least one string, and
    identifying, by the battery management system, a ground fault based on a correlated change of measured impedance of the multiple individual battery blocks along the at least one string,
    wherein the step of identifying a ground fault based on a correlated change of measured impedance of the individual battery blocks along the at least one string comprises a step of localizing a position of the ground fault by identifying a sequence of individual battery blocks on one side of the ground fault with a correlated change of measured impedance compared to another sequence of individual battery blocks on the other side of the ground fault along the at least one string.

2. The method according to claim 1, wherein the step of defining multiple individual battery blocks of battery cells along the at least one string comprises defining each of the multiple individual battery blocks comprising few individual battery cells.

3. The method according to claim 2, wherein the steps of performing a reference impedance measurement and performing a verification impedance measurement for the multiple individual battery blocks each comprise:
    generating, by the battery management system, at least one current pulse through the battery,
    measuring, by the battery management system, a voltage across each of the multiple individual battery blocks as response to the at least one current pulse,
    measuring, by the battery management system, a current across the multiple individual battery blocks as response to the at least one current pulse, and
    determining, by the battery management system, the impedance of each individual battery block based on the voltage and the current measured across the individual battery block as response to the at least one current pulse.

4. The method according to claim 3, wherein the step of generating at least one current pulse through the battery comprises generating at least one charge pulse and/or at least one discharge pulse.

5. The method according to claim 1, wherein the steps of performing a reference impedance measurement and performing a verification impedance measurement for the multiple individual battery blocks each comprise:
- generating, by the battery management system, at least one current pulse through the battery,
- measuring, by the battery management system, a voltage across each of the multiple individual battery blocks as response to the at least one current pulse,
- measuring, by the battery management system, a current across the multiple individual battery blocks as response to the at least one current pulse, and
- determining, by the battery management system, the impedance of each individual battery block based on the voltage and the current measured across the individual battery block as response to the at least one current pulse.

6. The method according to claim 5, wherein the step of generating at least one current pulse through the battery comprises generating at least one charge pulse and/or at least one discharge pulse.

7. The method according to claim 6, wherein the step of generating at least one current pulse through the battery comprises generating a current pulse train.

8. The method according to claim 7, wherein the method further comprises verifying a validity of the reference impedance measurement based on an elapsed period of time between the reference impedance measurement and the verification impedance measurement, and performing a further reference impedance measurement when the elapsed period of time exceeds a given time limit.

9. The method according to claim 5, wherein the step of generating at least one current pulse through the battery comprises generating a current pulse train.

10. The method according to claim 6, wherein the method further comprises verifying a validity of the reference impedance measurement based on an elapsed period of time between the reference impedance measurement and the verification impedance measurement, and performing a further reference impedance measurement when the elapsed period of time exceeds a given time limit.

11. The method according to claim 1, wherein the method further comprises verifying a validity of the reference impedance measurement based on an elapsed period of time between the reference impedance measurement and the verification impedance measurement, and performing a further reference impedance measurement when the elapsed period of time exceeds a given time limit.

12. The method according to claim 1, wherein the step of identifying a sequence of individual battery blocks with a correlated change of measured impedance compared to another sequence of individual battery blocks along the at least one string comprises determining a change of measured impedance individually for each individual battery block.

13. The method according to claim 12, wherein the step of identifying a sequence of individual battery blocks with a correlated change of measured impedance compared to another sequence of individual battery blocks along the at least one string comprises performing a change detection algorithm or a signal segmentation algorithm.

14. The method according to claim 1, wherein the step of identifying a sequence of individual battery blocks with a correlated change of measured impedance compared to another sequence of individual battery blocks along the at least one string comprises performing a change detection algorithm or a signal segmentation algorithm.

15. A battery management system for managing a battery of an uninterrupted power supply, the battery comprising at least one string with multiple battery cells, the battery management system is operable to:
- define multiple individual battery blocks of battery cells along the at least one string;
- perform a reference impedance measurement of the multiple individual battery blocks at a first point of time;
- perform a verification impedance measurement for the multiple individual battery blocks at a second point of time;
- evaluate a change of measured impedance between the reference impedance and the verification impedance for the multiple individual battery blocks of the at least one string; and
- identify a ground fault based on a correlated change of measured impedance of the multiple individual battery blocks along the at least one string;
- wherein the step of identifying a ground fault based on a correlated change of measured impedance of the individual battery blocks along the at least one string comprises a step of localizing a position of the ground fault by identifying a sequence of individual battery blocks on one side of the ground fault with a correlated change of measured impedance compared to another sequence of individual battery blocks on the other side of the ground fault along the at least one string.

16. A UPS device comprising a central DC link, a power supply side AC/DC converter, a power supply side DC/DC converter, and a load side output converter, whereby all converters are connected to the DC link, and the DC/DC converter is connected to a battery at its power supply side, wherein the UPS device comprises the battery management system according to claim 15.

17. A UPS system comprising multiple UPS devices, each UPS device comprising a central DC link, a power supply side AC/DC converter, a power supply side DC/DC converter, and a load side output converter, whereby all converters are connected to the DC link, and the DC/DC converters of the multiple UPS devices are connected to a battery at their power supply side, wherein the UPS system comprises the battery management system according to claim 15.

* * * * *